(12) United States Patent
Mizukami

(10) Patent No.: US 12,431,293 B2
(45) Date of Patent: *Sep. 30, 2025

(54) MULTILAYER CERAMIC ELECTRONIC COMPONENT, AND METHOD OF MANUFACTURING MULTILAYER CERAMIC ELECTRONIC COMPONENT

(71) Applicant: Murata Manufacturing Co., Ltd., Nagaokakyo (JP)

(72) Inventor: Miyuki Mizukami, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 460 days.

This patent is subject to a terminal disclaimer.

(21) Appl. No.: 16/596,875

(22) Filed: Oct. 9, 2019

(65) Prior Publication Data
US 2020/0126729 A1    Apr. 23, 2020

(30) Foreign Application Priority Data
Oct. 22, 2018    (JP) .................................. 2018-198422

(51) Int. Cl.
| | | |
|---|---|---|
| H01G 4/30 | (2006.01) | |
| B32B 18/00 | (2006.01) | |
| C04B 35/01 | (2006.01) | |
| H01G 4/005 | (2006.01) | |
| H01G 4/12 | (2006.01) | |
| H05K 1/03 | (2006.01) | |
| H05K 3/46 | (2006.01) | |

(52) U.S. Cl.
CPC ............... *H01G 4/30* (2013.01); *B32B 18/00* (2013.01); *C04B 35/01* (2013.01); *H01G 4/005* (2013.01); *H01G 4/1209* (2013.01); *H05K 1/0306* (2013.01); *H05K 3/4629* (2013.01); *C04B 2235/963* (2013.01)

(58) Field of Classification Search
None
See application file for complete search history.

(56) References Cited

U.S. PATENT DOCUMENTS

| | | | | |
|---|---|---|---|---|
| 10,361,031 | B2 * | 7/2019 | Asai | H01G 4/12 |
| 2012/0097428 | A1 * | 4/2012 | Kato | H05K 1/0218 |
| | | | | 174/250 |
| 2017/0040112 | A1 * | 2/2017 | Tanaka | H01G 4/232 |
| 2019/0071357 | A1 * | 3/2019 | Kaneda | H01G 4/40 |

FOREIGN PATENT DOCUMENTS

JP    08-55752 A    2/1996

* cited by examiner

*Primary Examiner* — Seth Dumbris
(74) *Attorney, Agent, or Firm* — Keating & Bennett, LLP

(57) ABSTRACT

A multilayer ceramic electronic component includes a component body, a first external electrode provided on a first end surface of the component body, and a second external electrode provided on a second end surface of the component body. An absolute value of a difference between a surface roughness of a first side surface and a surface roughness of a second side surface of the component body is smaller than an absolute value of a difference between a surface roughness of a first main surface and a surface roughness of a second main surface.

10 Claims, 7 Drawing Sheets

MULTILAYER CERAMIC ELECTRONIC COMPONENT, AND METHOD OF MANUFACTURING MULTILAYER CERAMIC ELECTRONIC COMPONENT

CROSS REFERENCE TO RELATED APPLICATIONS

This application claims the benefit of priority to Japanese Patent Application No. 2018-198422 filed on Oct. 22, 2018. The entire contents of this application are hereby incorporated herein by reference.

BACKGROUND OF THE INVENTION

1. Field of the Invention

The present invention relates to a multilayer ceramic electronic component and a method of manufacturing a multilayer ceramic electronic component.

2. Description of the Related Art

An example of a multilayer ceramic electronic component includes a multilayer ceramic capacitor. In order to manufacture a multilayer ceramic capacitor, for example, ceramic green sheets on which internal electrodes are formed are laminated, and the obtained unfired component body is fired, and then an external electrode is formed at the facing end surfaces of the sintered component body. As a result, a multilayer ceramic capacitor in which the internal electrodes extended to the end surfaces on both sides are electrically connected to the external electrodes is obtained.

When a voltage is applied to such a multilayer ceramic capacitor, distortion corresponding to the magnitude of the applied voltage occurs in the component body due to the electrostrictive effect and the reverse piezoelectric effect. Along with this, the component body repeats the expansion in the lamination direction and the contraction in the plane direction orthogonal to the lamination direction.

In recent years, with the progress of miniaturization of multilayer ceramic capacitors, the strength of the electric field applied to the dielectric has been increased, and the degree of distortion of the component body has also been increased.

In a case where the multilayer ceramic capacitor is mounted on the substrate, when a voltage is applied to the multilayer ceramic capacitor, distortion occurring in the component body vibrates the substrate fixed to the multilayer ceramic capacitor.

Here, when the substrate vibrates at a frequency of 20 Hz or more to 20 kHz or less which is an audible range, the vibration is recognized as an audible sound by the human ear. This phenomenon is also called "acoustic noise", and is a problem with notebook computers, mobile phones, etc. as the electronic devices are quieter.

Various proposals have been made to reduce such "acoustic noise". For example, Japanese Patent Application Laid-Open No. 08-55752 discloses a technique in which in order to suppress resonance with the substrate, the mounting direction of the multilayer ceramic capacitor is changed, and the multilayer ceramic capacitor is mounted on the substrate such that the lamination direction of the component body is along the main surface of the substrate.

A desired effect is not limited to the reduction in the "acoustic noise" described above. There is a demand for identifying the lamination direction of the component body in the multilayer ceramic capacitor. However, for example, in the case where the multilayer ceramic capacitor has a square prism shape, it is difficult to identify the lamination direction of the component body by the appearance.

The above problems are not limited to the problems with the multilayer ceramic capacitor, but are problems common to multilayer ceramic electronic components other than the multilayer ceramic capacitor.

SUMMARY OF THE INVENTION

Preferred embodiments of the present invention provide multilayer ceramic electronic components capable of easily identifying a lamination direction of a component body, and methods of manufacturing the multilayer ceramic electronic components.

A multilayer ceramic electronic component according to a preferred embodiment of the present invention includes a component body including a plurality of ceramic layers laminated in a lamination direction and a plurality of pairs of first internal electrodes and second internal electrodes, the component body including a first main surface and a second main surface facing each other in the lamination direction, a first side surface and a second side surface facing each other in a width direction orthogonal to the lamination direction, and a first end surface and a second end surface facing each other in a length direction orthogonal or substantially orthogonal to the lamination direction and the width direction, a first external electrode provided on the first end surface of the component body, and connected to the first internal electrodes at the first end surface, and a second external electrode provided on the second end surface of the component body, and connected to the second internal electrodes at the second end surface. An absolute value $|Ra_{S1}-Ra_{S2}|$ of a difference between a surface roughness $Ra_{S1}$ of the first side surface and a surface roughness $Ra_{S2}$ of the second side surface of the component body is smaller than an absolute value $|Ra_{M1}-Ra_{M2}|$ of a difference between a surface roughness $Ra_{M1}$ of the first main surface and a surface roughness $Ra_{M2}$ of the second main surface.

A method of manufacturing a multilayer ceramic electronic component according to a preferred embodiment of the present invention includes producing a mother block including a plurality of ceramic green sheets laminated in a lamination direction, and an internal electrode pattern disposed along each of a plurality of interfaces between the ceramic green sheets, by cutting the mother block along a cutting line in a first direction and a cutting line in a second direction orthogonal or substantially orthogonal to each other, obtaining a plurality of green chips having a laminated structure in which a plurality of ceramic layers and a plurality of pairs of first internal electrodes and second internal electrodes in an unfired state are configured, the green chips in which the first internal electrodes and the second internal electrodes are exposed at a cut side surface appearing by the cut along the cutting line in the first direction, obtaining an unfired component body by forming an unfired ceramic protective layer on the cut side surface, performing a grinding treatment on at least one of main surfaces of the unfired component body, the main surfaces facing each other in the lamination direction, and firing the unfired component body.

A method of manufacturing a multilayer ceramic electronic component according to a preferred embodiment of the present invention includes producing a mother block including a plurality of ceramic green sheets laminated in a lamination direction, and an internal electrode pattern disposed along each of a plurality of interfaces between the ceramic green sheets, by cutting the mother block along a cutting line in a first direction, obtaining a plurality of rod-shaped green block bodies having a laminated structure in which a plurality of ceramic layers in an unfired state and a plurality of pairs of first internal electrodes and second internal electrodes are configured, the rod-shaped green block bodies in which the first internal electrodes and the second internal electrodes are exposed at a cut side surface appearing by the cut along the cutting line in the first direction, forming an unfired ceramic protective layer on the cut side surface, obtaining a plurality of unfired component bodies by cutting, along a cutting line in a second direction orthogonal or substantially orthogonal to the first direction, the rod-shaped green block bodies on which the unfired ceramic protective layer is formed, performing a grinding treatment on at least one of main surfaces of the unfired component bodies, the main surfaces facing each other in the lamination direction, and firing the unfired component bodies.

According to preferred embodiments of the present invention, it is possible to provide multilayer ceramic electronic components that are each capable of easily identifying a lamination direction of a component body.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, multilayer ceramic electronic components according to preferred embodiments of the present invention and methods of manufacturing the multilayer ceramic electronic components according to preferred embodiments of the present invention will be described in detail with reference to the drawings.

The present invention is not limited to the following preferred embodiments, and can be applied by appropriately changing the configurations within a range not changing the gist of the present invention. Note that a combination of two or more individual preferred embodiments according to the present invention described below is also within the scope of the present invention.

A multilayer ceramic capacitor will be described as an example of a preferred embodiment of the multilayer ceramic electronic component according to the present invention. Preferred embodiments of the present invention can also be applied to multilayer ceramic electronic components other than the multilayer ceramic capacitor. Examples of such multilayer ceramic electronic components include an inductor, a piezoelectric element, a thermistor and the like.

Multilayer Ceramic Capacitor

As an example of a multilayer ceramic capacitor according to a preferred embodiment of the present invention, a multilayer ceramic capacitor obtained by a method of manufacturing the multilayer ceramic capacitor according to a preferred embodiment described below will be described.

Figure 1:
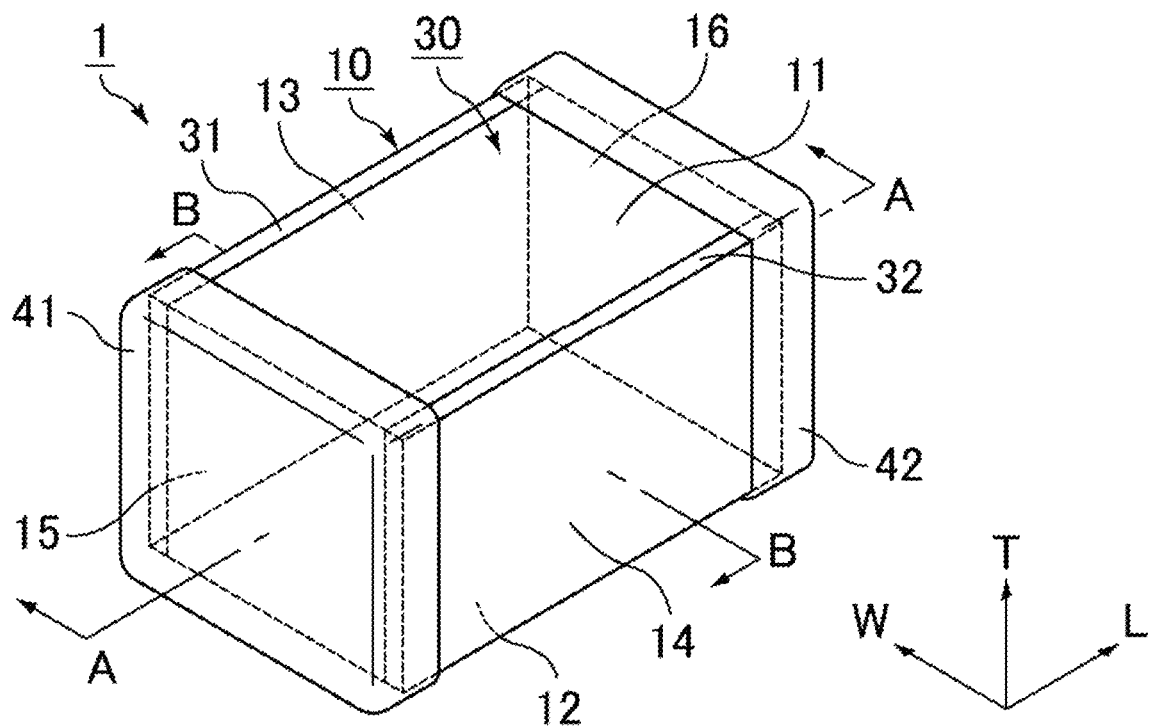
FIG. 1 is a perspective view schematically showing an example of a multilayer ceramic capacitor according to a preferred embodiment of the present invention.
Figure 2:
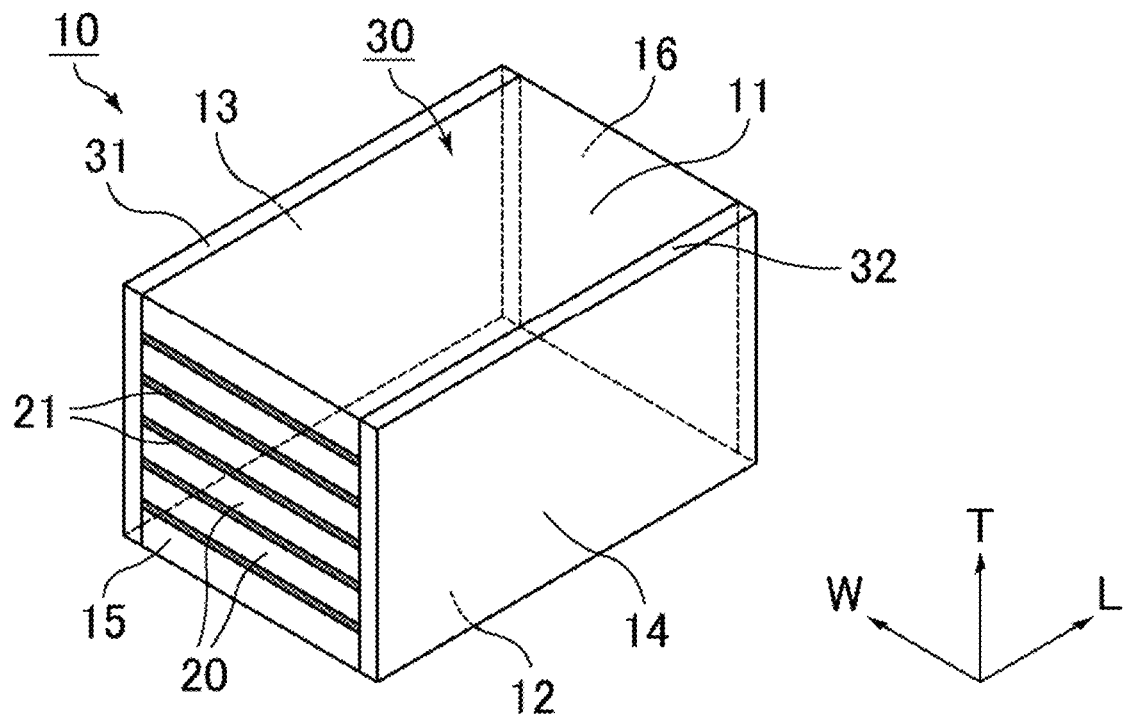
FIG. 2 is a perspective view schematically showing an example of a component body constituting the multilayer ceramic capacitor shown in FIG. 1.
Figure 3:
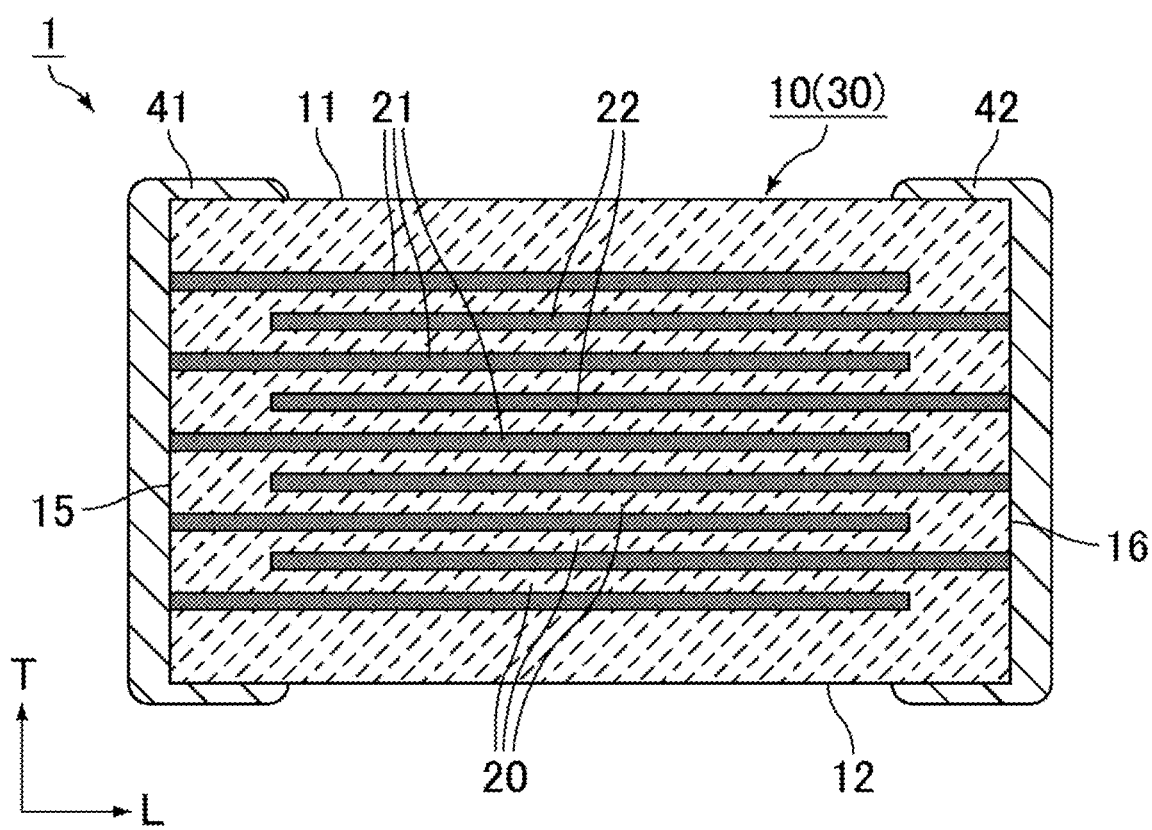
FIG. 3 is a cross-sectional view of the multilayer ceramic capacitor shown in FIG. 1, taken along line A-A.
Figure 4:
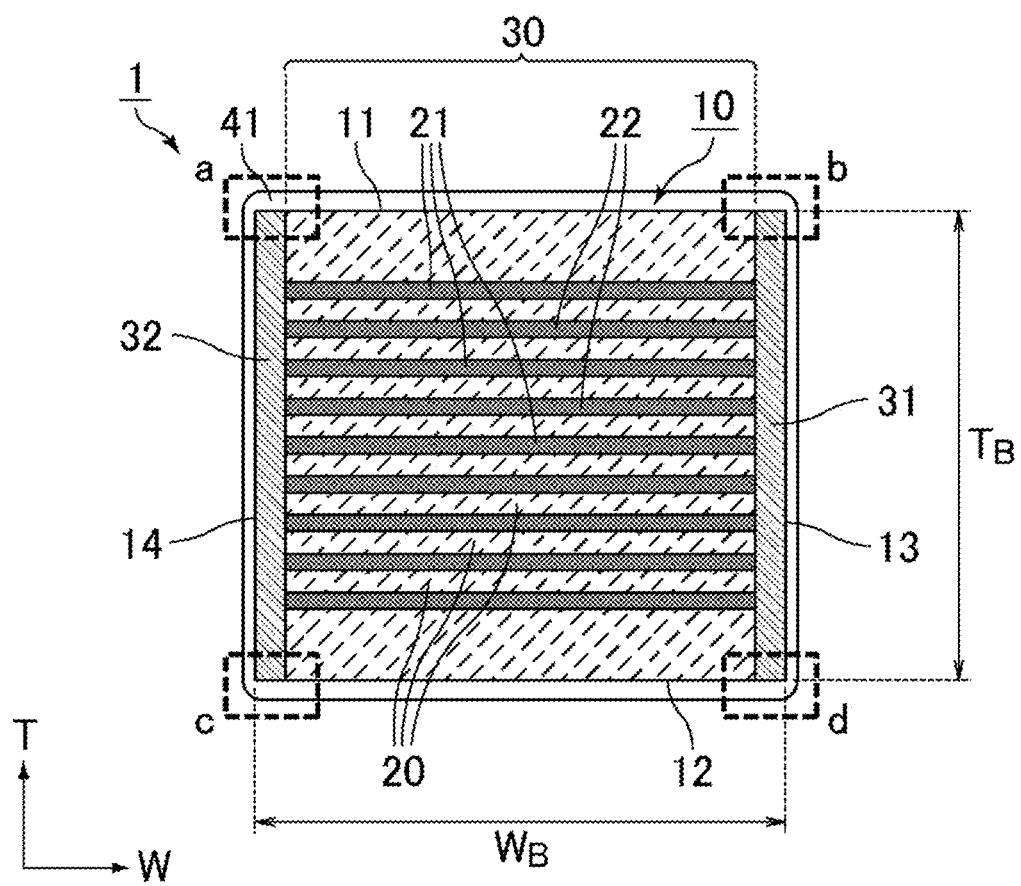
FIG. 4 is a cross-sectional view of the multilayer ceramic capacitor shown in FIG. 1, taken along line B-B.

FIG. 1 is a perspective view schematically showing an example of a multilayer ceramic capacitor according to a preferred embodiment of the present invention. FIG. 2 is a perspective view schematically showing an example of a component body of the multilayer ceramic capacitor shown in FIG. 1. FIG. 3 is a cross-sectional view of the multilayer ceramic capacitor shown in FIG. 1, taken along line A-A. FIG. 4 is a cross-sectional view of the multilayer ceramic capacitor shown in FIG. 1, taken along line B-B.

In the present specification, the lamination direction, the width direction, and the length direction of the multilayer ceramic capacitor and the component body are indicated by arrows T, W and L, respectively, in a multilayer ceramic capacitor 1 shown in FIG. 1 and a component body 10 shown in FIG. 2. Here, the lamination (T) direction, the width (W) direction, and the length (L) direction are orthogonal or substantially orthogonal to each other. The lamination (T) direction is a direction in which a plurality of ceramic layers 20 and a plurality of pairs of first internal electrodes 21 and second internal electrodes 22 are laminated.

The multilayer ceramic capacitor 1 shown in FIG. 1 includes the component body 10. As shown in FIG. 2, the component body 10 preferably has a rectangular parallelepiped shape or a substantially rectangular parallelepiped shape, and includes a first main surface 11 and a second main surface 12 facing each other in the lamination (T) direction, a first side surface 13 and a second side surface 14 facing each other in the width (W) direction orthogonal or substantially orthogonal to the lamination (T) direction, and a first end surface 15 and a second end surface 16 facing each other in the length (L) direction orthogonal or substantially orthogonal to the lamination (T) direction and the width (W) direction.

The component body 10 preferably has rounded corners and ridges. The corner is a portion at which three surfaces of the component body intersect, and the ridge is a portion at which two surfaces of the component body intersect.

In the present specification, the cross section of the multilayer ceramic capacitor 1 or the component body 10 orthogonal or substantially orthogonal to the first end surface 15 and the second end surface 16 and parallel or substantially parallel to the lamination (T) direction is referred to as an LT cross section which is a cross section in the length (L) direction and in the lamination (T) direction. In addition, the cross section of the multilayer ceramic capacitor 1 or the component body 10 orthogonal or substantially orthogonal to the first side surface 13 and the second side surface 14 and parallel or substantially parallel to the lamination (T) direction is referred to as a WT cross section which is a cross section in the width (W) direction and the lamination (T) direction. Further, the cross section of the multilayer ceramic capacitor 1 or the component body 10 orthogonal or substantially orthogonal to the first side surface 13, the second side surface 14, the first end surface 15, and the second end surface 16 and orthogonal or substantially orthogonal to the lamination (T) direction is referred to as an LW cross section which is a cross section in the length (L) direction and the width (W) direction. Therefore, FIG. 3 shows the LT cross section of the multilayer ceramic capacitor 1, and FIG. 4 shows the WT cross section of the multilayer ceramic capacitor 1.

Figure 5:
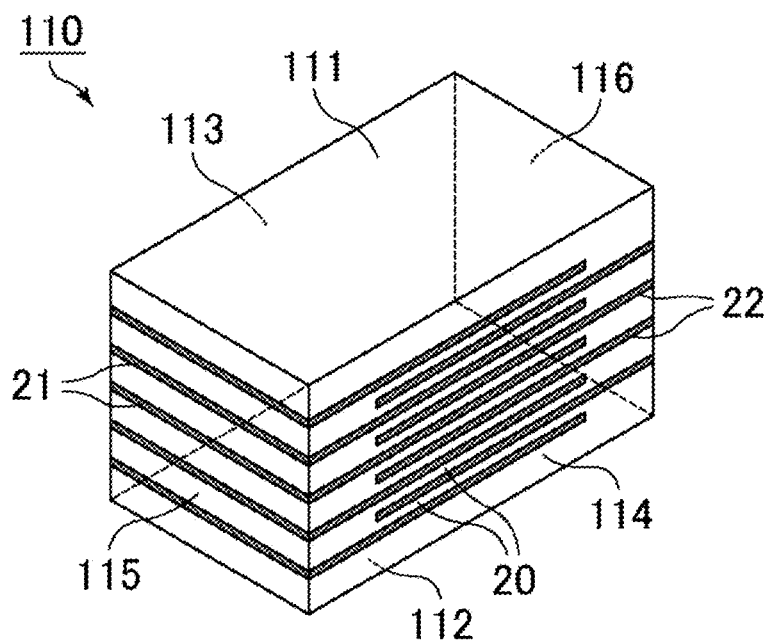
FIG. 5 is a perspective view schematically showing an example of a green chip prepared for producing the component body shown in FIG. 2.
Figure 6A:
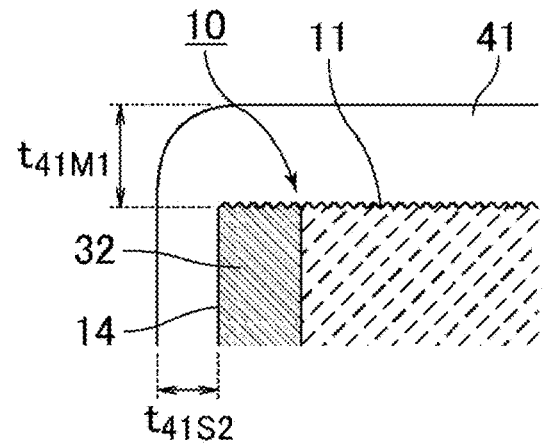
FIGS. 6A to 6D are enlarged views of portion a, portion b, portion c, and portion d in FIG. 4, respectively.
Figure 6B:
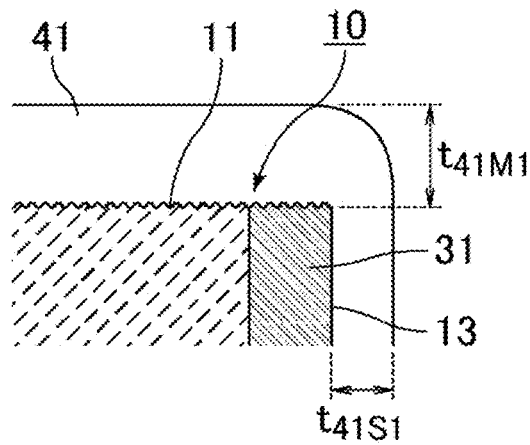
Figure 6C:
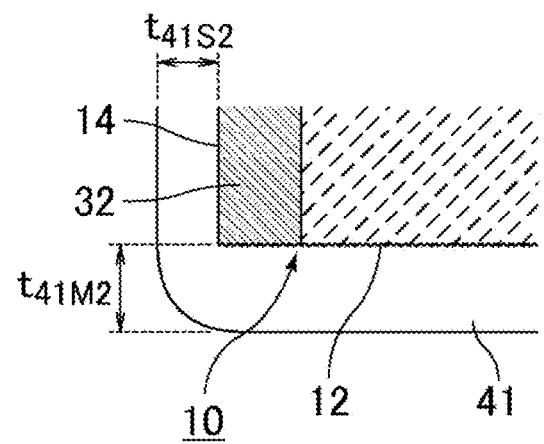
Figure 6D:
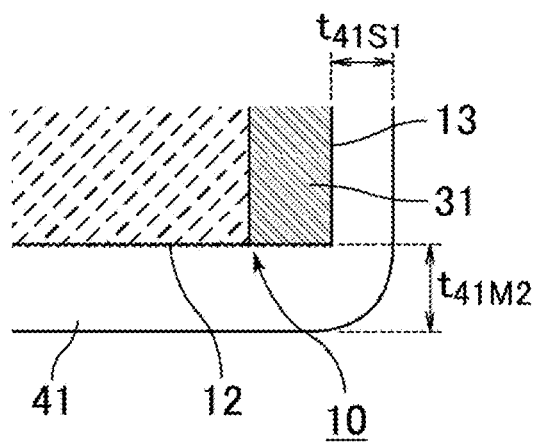

FIG. 5 is a perspective view schematically showing an example of a green chip prepared for producing the component body shown in FIG. 2.

As will be described later, the component body 10 shown in FIG. 2 is obtained by forming unfired ceramic protective layers 31 and 32 (see FIG. 2) on a pair of facing side surfaces (hereinafter also referred to as a cut side surface) 113 and 114 of a green chip 110 shown in FIG. 5 to fire it. In the following description, the portion obtained from the green chip 110 in the component body 10 after firing will be referred to as a laminated portion 30.

As shown in FIGS. 2, 3 and 4, the laminated portion 30 in the component body 10 has a laminated structure including a plurality of ceramic layers 20 extending in the direction of the first main surface 11 and the second main surface 12 and laminated in the direction orthogonal or substantially orthogonal to the first main surface 11 and the second main surface 12, and a plurality of pairs of first internal electrodes 21 and second internal electrodes 22 provided along the interface between the ceramic layers 20. The component body 10 includes a pair of ceramic protective layers 31 and 32 disposed on the cut side surfaces 113 and 114 (see FIG. 5) of the laminated portion 30 to provide the first side surface 13 and the second side surface 14. The thicknesses of the ceramic protective layers 31 and 32 are preferably the same or substantially the same.

In FIGS. 1, 2 and 4, the boundaries between the laminated portion 30 and each of the ceramic protective layers 31 and 32 are clearly illustrated for the convenience of description, but such boundaries may not appear clearly.

As shown in FIGS. 2, 3, 4 and 5, the first internal electrodes 21 and the second internal electrodes 22 face each other with the ceramic layers 20 interposed therebetween. The electrical characteristics are produced by the first internal electrode 21 and the second internal electrode 22 facing each other. That is, capacitance is produced in the multilayer ceramic capacitor 1 shown in FIG. 1.

The first internal electrode 21 includes an exposed end exposed to the first end surface 15 of the component body 10, and the second internal electrode 22 includes an exposed end exposed to the second end surface 16 of the component body 10. On the other hand, since the above-described ceramic protective layers 31 and 32 are provided, the first internal electrode 21 and the second internal electrode 22 are not exposed to the first side surface 13 and the second side surface 14 of the component body 10.

As shown in FIGS. 1 and 3, the multilayer ceramic capacitor 1 further includes a first external electrode 41 provided on at least the first end surface 15 of the component body 10 so as to be electrically connected to the exposed end of each of the first internal electrodes 21, and a second external electrode 42 provided on at least the second end surface 16 of the component body 10 so as to be electrically connected to the exposed end of each of the second internal electrodes 22.

In FIG. 1, the first external electrode 41 includes a portion extending around a portion of each of the first main surface 11, the second main surface 12, the first side surface 13, and the second side surface 14 of the component body 10. Similarly, the second external electrode 42 includes a portion extending around a portion of each of the first main surface 11, the second main surface 12, the first side surface 13 and the second side surface 14 of the component body 10.

In the multilayer ceramic capacitor 1 shown in FIG. 1, the absolute value $|Ra_{S1}-Ra_{S2}|$ of the difference between the surface roughness $Ra_{S1}$ of the first side surface 13 and the surface roughness $Ra_{S2}$ of the second side surface 14 of the component body 10 is smaller than the absolute value $|Ra_{M1}-Ra_{M2}|$ of the difference between the surface roughness $Ra_{M1}$ of the first main surface 11 and the surface roughness $Ra_{M2}$ of the second main surface 12.

When the difference in surface roughness on the side surface of the component body and the difference in surface roughness on the main surface are different, the lamination direction of the component body can be easily identified by measuring the surface roughness of the main surface and side surface of the component body. Therefore, it is possible to determine the direction in a process such as a mounting process and a marking process which require screening of the direction of the component body, or an inspection and an analysis which require screening of the direction of the component body.

In the present specification, the surface roughness is an arithmetic mean roughness Ra defined by JIS B 0601: 2001.

The surface roughness is measured using a non-contact profilometer (VK-X200 manufactured by KEYENCE CORPORATION) with a cutoff value λc of about 0.8 μm, for example.

In the case of manufacturing the multilayer ceramic capacitor 1 shown in FIG. 1 according to a method of manufacturing a multilayer ceramic capacitor according to a preferred embodiment described later, it is preferable that the surface roughness $Ra_{S1}$ of the first side surface 13 and the surface roughness $Ra_{S2}$ of the second side surface 14 of the component body 10 is smaller than the surface roughness $Ra_{M1}$ of the first main surface 11, and be smaller than the surface roughness $Ra_{M2}$ of the second main surface 12.

FIGS. 6A to 6D are enlarged views of portion a, portion b, portion c, and portion d in FIG. 4, respectively.

In FIGS. 6A to 6D, while the surface roughness of the first side surface 13 of the component body 10 is the same or substantially the same as the surface roughness of the second side surface 14, the surface roughness of the first main surface 11 is larger than the surface roughness of the second main surface 12. Therefore, the absolute value $|Ra_{S1}-Ra_{S2}|$ of the difference between the surface roughness $Ra_{S1}$ of the first side surface 13 and the surface roughness $Ra_{S2}$ of the second side surface 14 is smaller than the absolute value $|Ra_{M1}-Ra_{M2}|$ of the difference between the surface roughness $Ra_{M1}$ of the first main surface 11 and the surface roughness $Ra_{M2}$ of the second main surface 12.

Further, in FIGS. 6A to 6D, the surface roughness of the first side surface 13 of the component body 10 is smaller than the surface roughness of the first main surface 11, and smaller than the surface roughness of the second main surface 12. Similarly, the surface roughness of the second side surface 14 of the component body 10 is smaller than the surface roughness of the first main surface 11 and smaller than the surface roughness of the second main surface 12.

When the surface roughness is different between the main surface and the side surface of the component body 10, the thicknesses of the first external electrode 41 and the second external electrode 42 may be different. Specifically, the external electrode on the surface having a large surface roughness tends to be thick. In this case, the lamination direction of the component body can also be identified by measuring the thicknesses of the first external electrode and the second external electrode on the main surface and the side surface of the component body.

In the case where the first external electrode 41 extends around a portion of each of the first main surface 11, the second main surface 12, the first side surface 13 and the second side surface 14 of the component body 10, as shown in FIGS. 6A to 6D, it is preferable that the thicknesses of the first external electrode 41 provided on the first side surface 13 and the second side surface 14 of the component body 10 (lengths represented by $t_{41S1}$ and $t_{41S2}$ in FIGS. 6A to 6D) is smaller than the thicknesses of the first external electrode 41 provided on the first main surface 11 and the second main surface 12 of the component body 10 (lengths represented by $t_{41M1}$ and $t_{41M2}$ in FIGS. 6A to 6D).

Similarly, in the case where the second external electrode 42 extends around a portion of each of the first main surface 11, the second main surface 12, the first side surface 13 and the second side surface 14 of the component body 10, it is preferable that the thicknesses of the second external electrode 42 provided on the first side surface 13 and the second side surface 14 of the component body 10 be smaller than the thicknesses of the second external electrode 42 provided on the first main surface 11 and the second main surface 12 of the component body 10.

The thickness of the first external electrode 41 provided on each surface of the component body 10 may be different from the thickness of the second external electrode 42 provided on the corresponding each surface, but is preferably the same or substantially the same.

The thickness $t_{41S1}$ of the first external electrode 41 provided on the first side surface 13 of the component body 10 may be different from the thickness $t_{41S2}$ of the first external electrode 41 provided on the second side surface 14, but is preferably the same or substantially the same. Similarly, the thickness of the second external electrode 42 provided on the first side surface 13 of the component body 10 may be different from the thickness of the second external electrode 42 provided on the second side surface 14, but is preferably the same or substantially the same.

As shown in FIG. 4, when the dimension in the lamination (T) direction of the component body 10 is $T_B$ and the dimension in the width (W) direction of the component body 10 is $W_B$, the value of $T_B/W_B$ is not particularly limited, but the value is preferably, for example, about 0.6 or more and about 1.7 or less, and more preferably about 0.7 or more and about 1.3 or less.

When the component body has a shape close to a square prism, it is difficult to identify the lamination direction by the appearance. Even in such a case, the lamination direction of the component body can be easily identified by measuring the surface roughness of the main surface and the side surface of the component body.

As described above, preferred embodiments of the present invention can be applied to multilayer ceramic electronic components other than multilayer ceramic capacitors. For example, when the multilayer ceramic electronic component is a piezoelectric element, a piezoelectric ceramic such as a PZT-based ceramic is used, and when the multilayer ceramic electronic component is a thermistor, a semiconductor ceramic such as a spinel-based ceramic is used.

An example of a ceramic material of the ceramic layer and the ceramic protective layer of a multilayer ceramic capacitor includes a dielectric ceramic containing $BaTiO_3$, $CaTiO_3$, $SrTiO_3$, $CaZrO_3$, or the like as a main component.

The ceramic material of the ceramic protective layer preferably has at least the same main component as the ceramic material of the ceramic layer. In this case, it is particularly preferable that ceramic materials of the same composition are used for both of the ceramic layer and the ceramic protective layer.

An example of a conductive material used for an internal electrode may include metal materials such as Ni, Cu, Ag, Pd, Ag—Pd alloy, Au, or the like.

The external electrode preferably includes a foundation layer and a plating layer provided on the foundation layer. An example of the conductive material forming the foundation layer may include Cu, Ni, Ag, Pd, Ag—Pd alloy, Au, or the like. The foundation layer may be formed by performing a co-firing method of applying a conductive paste to an unfired component body and co-firing the component body, or may be formed by performing a post-firing method of applying the conductive paste on the component body after firing and firing it. Alternatively, the foundation layer may be formed by direct plating, or may be formed by curing a conductive resin containing a thermosetting resin.

The plating layer provided on the foundation layer preferably has, for example, a two-layer structure of Ni plating and Sn plating thereon.

When the multilayer ceramic capacitor according to the present preferred embodiment is mounted on a substrate, the first main surface or the second main surface of the component body may be a mounting surface, or the first side surface or the second side surface of the component body may be a mounting surface.

When the first main surface or the second main surface of the component body is the mounting surface, the external electrodes provided on the first side surface and the second side surface of the component body can be thinned, so that a plurality of electronic components can be mounted in close proximity to each other. On the other hand, when the first side surface or the second side surface of the component body is a mounting surface, the problem of "acoustic noise" can be reduced.

Method of Manufacturing Multilayer Ceramic Capacitor

As a non-limiting example of a method of manufacturing the multilayer ceramic capacitor according to a preferred embodiment of the present invention, an example of the method of manufacturing the multilayer ceramic capacitor 1 shown in FIG. 1 will be described.

First, a ceramic green sheet to be the ceramic layer 20 is prepared. The ceramic green sheet contains a binder, a solvent and the like in addition to the ceramic raw material containing the dielectric ceramic described above. The ceramic green sheet is formed, for example, on a carrier film using a die coater, a gravure coater, a microgravure coater or the like.

The thickness of the ceramic green sheet is usually about 3 μm or less, preferably about 1 μm or less, and more preferably about 0.6 μm or less, for example.

Next, the conductive paste is applied to the ceramic green sheet with a predetermined pattern to form an internal electrode pattern. The conductive paste contains a binder, a solvent, and the like in addition to the above-described metal material.

Figure 7:
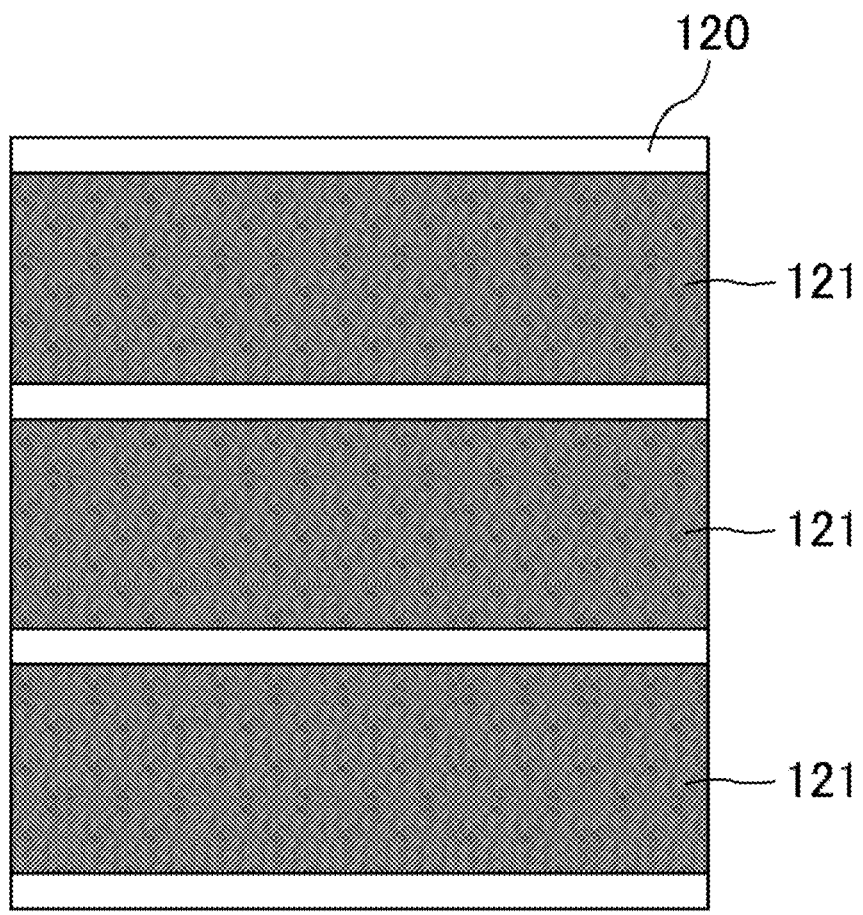
FIG. 7 is a plan view schematically showing an example of a ceramic green sheet on which an internal electrode pattern is formed.

FIG. 7 is a plan view schematically showing an example of a ceramic green sheet on which an internal electrode pattern is formed.

As shown in FIG. 7, conductive paste is applied to a ceramic green sheet 120 to be the ceramic layer 20 with a predetermined pattern, thus forming an internal electrode pattern 121 to be each of the first internal electrode 21 and the second internal electrode 22. Specifically, the strip-shaped internal electrode pattern 121 in multiple rows is formed on the ceramic green sheet 120.

The thickness of the internal electrode pattern is not particularly limited, but is preferably about 1.5 μm or less, for example.

Thereafter, the lamination process is performed such that a predetermined number of ceramic green sheets are laminated while shifting the ceramic green sheets on which the internal electrode pattern is formed, and a predetermined number of ceramic green sheets on which the internal electrode pattern is not formed are laminated above and below the ceramic green sheets with the internal electrode pattern.

Figure 8:
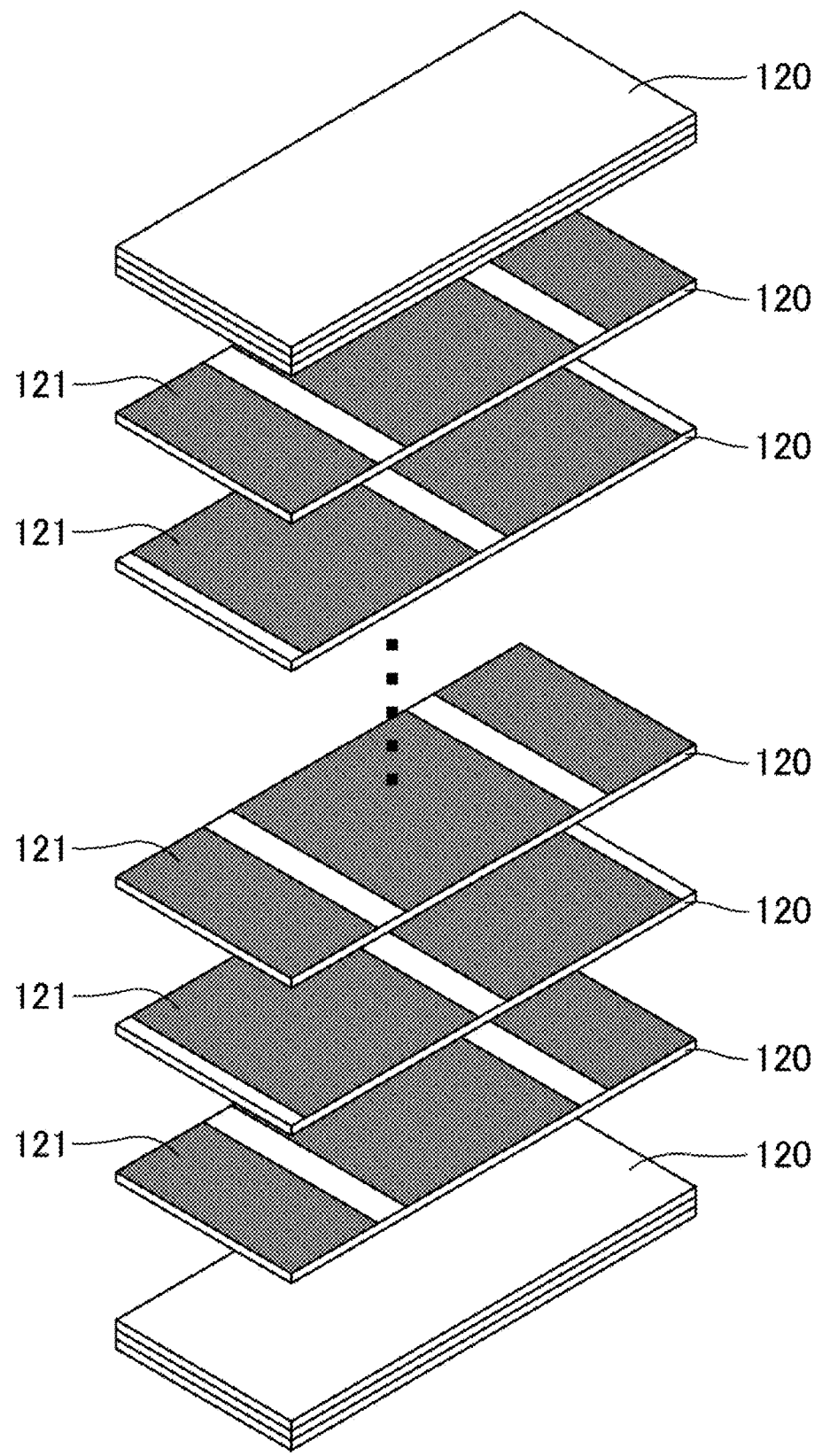
FIG. 8 is a perspective view for describing a process of laminating ceramic green sheets.

FIG. 8 is a perspective view for describing a process of laminating ceramic green sheets.

As shown in FIG. 8, the predetermined number of ceramic green sheets 120 on which the internal electrode pattern 121 is formed are laminated while shifted by a predetermined distance along the width direction of the internal electrode pattern 121, that is, by half the width direction dimension of the internal electrode pattern 121. Further, a predetermined number of ceramic green sheets 120 having no internal electrode pattern 121 formed thereon are laminated above and below the ceramic green sheets 120 with the internal electrode pattern 121. Although three ceramic green sheets 120 having no internal electrode pattern 121 are laminated in FIG. 8, the number of the ceramic green sheets 120 having no internal electrode pattern 121 can be appropriately changed.

Figure 9A:
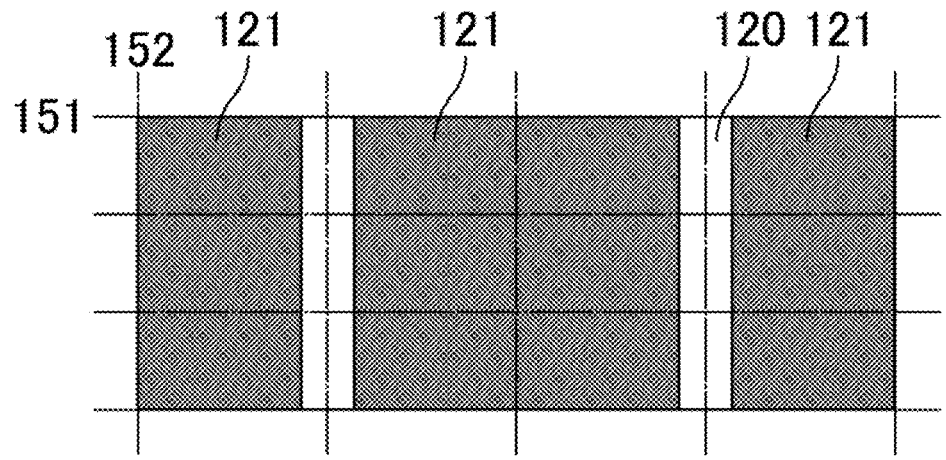
FIGS. 9A to 9C are plan views for describing a process of laminating the ceramic green sheets.
Figure 9B:
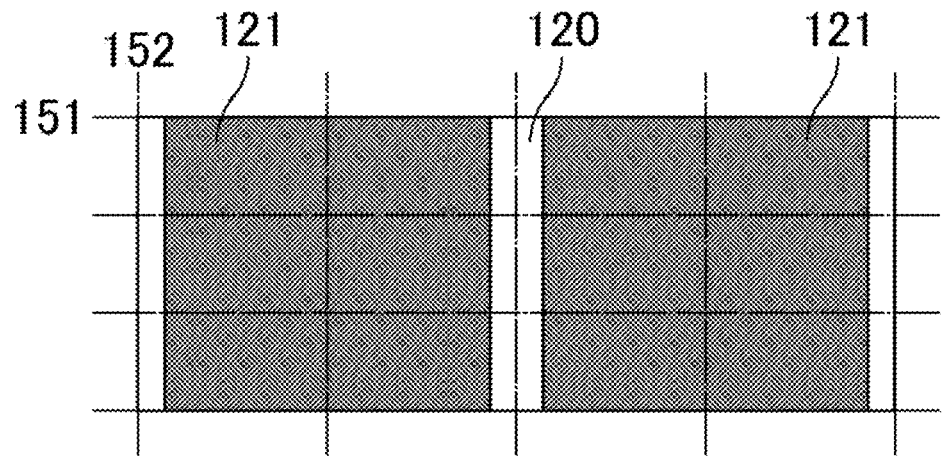
Figure 9C:
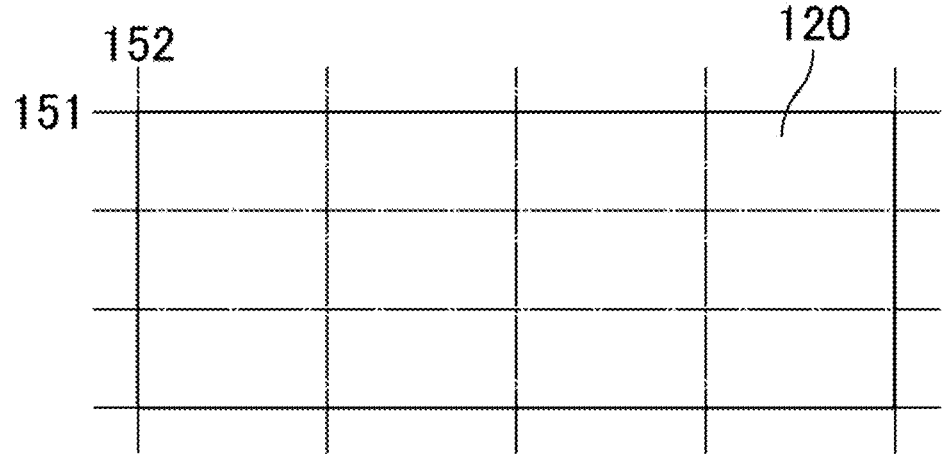

FIGS. 9A to 9C are plan views for describing a process of laminating ceramic green sheets.

FIGS. 9A to 9C are enlarged views of the ceramic green sheet 120 on which the internal electrode pattern 121 corresponding to the first internal electrode 21 is formed, the ceramic green sheet 120 on which the internal electrode pattern 121 corresponding to the second internal electrode 22 is formed, and the ceramic green sheet 120 on which the internal electrode pattern 121 is not formed, respectively.

FIGS. 9A to 9C show a cutting line 151 in a first direction (horizontal direction in FIGS. 9A to 9C) orthogonal or substantially orthogonal to the direction in which the strip-shaped internal electrode pattern 121 extends, and a cutting line 152 in a second direction (vertical direction in FIGS. 9A to 9C) orthogonal or substantially orthogonal to the cutting line 151. The strip-shaped internal electrode pattern 121 has a configuration in which two electrodes, that is, the first internal electrode 21 and the second internal electrode 22, which are connected by their respective extended portions, are continuous along the second direction. In FIGS. 9A to 9C, the cutting lines 151 and 152 are shown in common.

As a result of the lamination process, a mother block which includes a plurality of laminated ceramic green sheets and the internal electrode pattern arranged along each of a plurality of interfaces between the ceramic green sheets is obtained. The obtained mother block is pressed in the lamination direction by a method, such as an isostatic press, for example.

A plurality of green chips (see FIG. 5) can be obtained by cutting the pressed mother block along the cutting line 151 in the first direction and the cutting line 152 in the second direction orthogonal or substantially orthogonal to each other. For this cutting, for example, a method such as cutting with a dicing machine, push-cutting, laser cutting or the like is applied.

Each green chip 110 shown in FIG. 5 has a laminated structure including a plurality of ceramic layers 20 in an unfired state, and a plurality of pairs of the first internal electrodes 21 and the second internal electrodes 22. The cut side surfaces 113 and 114 of the green chip 110 are surfaces obtained by the cut along the cutting line 151 in the first direction, and cut end surfaces 115 and 116 are surfaces obtained by the cut along the cutting line 152 in the second direction. All of the first internal electrode 21 and the second internal electrode 22 are exposed at the cut side surfaces 113 and 114. Further, only the first internal electrode 21 is exposed at the cut end surface 115, and only the second internal electrode 22 is exposed at the cut end surface 116.

Unfired ceramic protective layers 31 and 32 are formed on the cut side surfaces 115 and 116 of the obtained green chip 110, respectively. After forming the unfired ceramic protective layer, the drying process is performed, if necessary. Thus, the unfired component body 10 is obtained.

The unfired ceramic protective layer is preferably formed by attaching a ceramic protective layer green sheet to the cut side surface of the green chip.

It is preferable that the ceramic protective layer green sheet contain, as a main component, the same or substantially the same ceramic raw material as that of the ceramic green sheet for producing a mother block.

The ceramic protective layer green sheet and the cut side surface 113 of the green chip 110 are made to face each other, pressed and punched out, thus forming an unfired ceramic protective layer 31. Furthermore, the ceramic protective layer green sheet is also made to face the cut side surface 114 of the green chip 110, pressed and punched out, thus forming an unfired ceramic protective layer 32. At this time, it is preferable to apply an organic solvent as an adhesive to the side surface of the green chip 110 in advance.

After the unfired ceramic protective layers 31 and 32 are formed, a grinding treatment is performed on at least one of the main surfaces 111 and 112 (see FIG. 5) of the unfired component body 10. The grinding treatment may be performed on either one of the main surfaces 111 and 112 (see FIG. 5) of the unfired component body 10, or may be performed on both the main surfaces 111 and 112.

When the grinding treatment is performed on the main surface of the unfired component body, the surface roughness of the main surface increases. Therefore, for example, the absolute value $|Ra_{M1}-Ra_{M2}|$ of the difference between the surface roughness $Ra_{M1}$ of the first main surface and the surface roughness $Ra_{M2}$ of the second main surface can be increased by performing the grinding treatment on either one of the main surfaces. On the other hand, when a side surface of the unfired component body is formed by attaching a ceramic protective layer green sheet, the surface roughness $Ra_{S1}$ of the first side surface and the surface roughness $Ra_{S2}$ of the second side surface are the same or approximately the same, so that the absolute value $|Ra_{S1}-Ra_{S2}|$ of the difference in surface roughness decreases. As a result, the absolute value $|Ra_{S1}-Ra_{S2}|$ of the difference between the surface roughness $Ra_{S1}$ of the first side surface and the surface roughness $Ra_{S2}$ of the second side surface of the unfired component body can be made smaller than the absolute value $|Ra_{M1}-Ra_{M2}|$ of the difference between the surface roughness $Ra_{M1}$ of the first main surface and the surface roughness $Ra_{M2}$ of the second main surface.

In particular, it is preferable that the surface roughness $Ra_{S1}$ of the first side surface and the surface roughness $Ra_{S2}$ of the second side surface of the unfired component body are smaller than the surface roughness $Ra_{M1}$ of the first main surface, and are smaller than the surface roughness $Ra_{M2}$ of the second main surface.

The value of $T_B/W_B$ is preferably, for example, about 0.6 or more and about 1.7 or less, and more preferably about 0.7 or more and about 1.3 or less in the unfired component body on which the grinding treatment has been performed.

Therefore, when a mother block is manufactured, it is preferable that the number of laminated ceramic green sheets on which the internal electrode pattern is not formed is increased, and the dimension of the green chip 110 in the lamination (T) direction is made to larger than the dimension of the component body in the lamination (T) direction. In this case, it is preferable to laminate a larger number of ceramic green sheets on which the internal electrode pattern is not formed on the main surface on which the grinding treatment is performed.

Examples of the grinding treatment include a grinding treatment using fixed abrasive (cutting with a dicing machine, grinding, etc.), a polishing treatment using fixed abrasive (dry polishing, tape grinding, etc.), a polishing treatment using free abrasive (lapping, polishing, etc.) and the like. These grinding treatments may be combined.

A cleaning treatment may be performed on the main surface after the grinding treatment has been performed. Examples of the cleaning treatment include ultrasonic cleaning and the like.

If necessary, a rinsing treatment may be performed to wash away the fluid (the grinding fluid and, if necessary, the cleaning fluid) attached to the unfired component body. In the rinsing treatment, washing with water is preferably performed, and ultrasonic cleaning with water is more preferably performed.

After the rinsing treatment, a drying process is preferably performed. Examples of a method of the drying process include a method of dispelling water by air, a method of rotating an object to dispel water by centrifugal force, a method of dispelling water by air and centrifugal force, a method of drying an object in an oven at a set temperature of about 40° C. or more to about 100° C. or less, and the like.

Thereafter, the unfired component body is fired. The firing temperature is preferably, for example, in the range of about 900° C. or more and about 1300° C. or less, depending on the ceramic material and the metal material contained in the unfired component body.

A conductive paste is applied to both end surfaces of the fired component body, baked, and plated if necessary, to form an external electrode. The application of the conductive paste may be performed on the unfired component body, or the conductive paste may be simultaneously baked when the unfired component body is fired.

As described above, the multilayer ceramic capacitor 1 shown in FIG. 1 is manufactured.

The unfired ceramic protective layer may be formed by applying a ceramic protective layer paste to the cut side surface of the green chip.

The present invention is not limited to the above-described preferred embodiments, and various applications and modifications may be made within the scope of the present invention with regard to the configuration, manufacturing conditions, etc. of multilayer ceramic electronic components including the multilayer ceramic capacitor.

In the method according to the preferred embodiment described above, after the mother block is cut along a cutting line in the first direction and a cutting line in the second direction to obtain a plurality of green chips, an unfired ceramic protective layer is formed on the cut side surface, but it is also possible to change the method as follows.

That is, after obtaining a plurality of rod-shaped green block bodies in which the first internal electrodes and the second internal electrodes are exposed at the cut side surface obtained by the cut along the cutting line in the first direction by cutting the mother block only along the cutting line in the first direction, an unfired ceramic protective layer on the cut side surface may be formed, and then, may be cut along the cutting line in the second direction to obtain a plurality of unfired component bodies. After that, the grinding treatment may be performed on at least one of the main surfaces of each of the unfired component bodies, and then, the unfired component body may be fired. After firing, a multilayer ceramic electronic component such as a multilayer ceramic capacitor can be manufactured by performing the same or substantially the same process as that of the above-described preferred embodiments.

In addition, the multilayer ceramic electronic component according to a preferred embodiment of the present invention may be manufactured by a method other than the method of forming a ceramic protective layer. For example, when the mother block is cut, a plurality of green chips or rod-shaped green block bodies in which the first internal electrode and the second internal electrode are not exposed at the cut side surface may be obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic electronic component comprising:
a component body including a plurality of ceramic layers laminated in a lamination direction and a plurality of pairs of first internal electrodes and second internal electrodes, the component body including a first main surface and a second main surface facing each other in the lamination direction, a first side surface and a second side surface facing each other in a width direction orthogonal or substantially orthogonal to the lamination direction, and a first end surface and a second end surface facing each other in a length direction orthogonal or substantially orthogonal to the lamination direction and the width direction;
a first external electrode provided on the first end surface of the component body, and connected to the first internal electrodes at the first end surface; and
a second external electrode provided on the second end surface of the component body, and connected to the second internal electrodes at the second end surface;
wherein an absolute value $|Ra_{S1}\text{-}Ra_{S2}|$ of a difference between a surface roughness $Ra_{S1}$ of the first side surface and a surface roughness $Ra_{S2}$ of the second side surface of the component body is smaller than an absolute value $|Ra_{M1}\text{-}Ra_{M2}|$ of a difference between a surface roughness $Ra_{M1}$ of the first main surface and a surface roughness $Ra_{M2}$ of the second main surface;
the surface roughness of at least one of the first side surface and the second side surface is smaller than the surface roughness of each of the first main surface and the second main surface;

the first external electrode extends around a portion of each of the first main surface, the second main surface, the first side surface, and the second side surface of the component body;

a thickness of the first external electrode provided on the first side surface and the second side surface of the component body is smaller than a thickness of the first external electrode provided on the first main surface and the second main surface of the component body;

the second external electrode extends around a portion of each of the first main surface, the second main surface, the first side surface, and the second side surface of the component body;

a thickness of the second external electrode provided on the first side surface and the second side surface of the component body is smaller than a thickness of the second external electrode provided on the first main surface and the second main surface of the component body; and the thickness of the first external electrode on at least one of the first main surface, the second main surface, the first side surface, and the second side surface is different from the-average thickness of the second external electrode on the corresponding at least one of the first main surface, the second main surface, the first side surface, and the second side surface.

2. The multilayer ceramic electronic component according to claim 1, wherein both of the surface roughness $Ra_{S1}$ of the first side surface and the surface roughness $Ra_{S2}$ of the second side surface of the component body are smaller than the surface roughness $Ra_{M1}$ of the first main surface, and are smaller than the surface roughness $Ra_{M1}$ of the second main surface.

3. The multilayer ceramic electronic component according to claim 1, wherein a value of $T_B/W_B$ is about 0.7 or more and about 1.3 or less, where $T_B$ is a dimension of the component body in the lamination direction and WB is a dimension of the component body in the width direction.

4. The multilayer ceramic electronic component according to claim 1, wherein the component body includes rounded corners and ridges.

5. The multilayer ceramic electronic component according to claim 1, wherein the surface roughness $Ra_{S1}$ of the first side surface and the surface roughness $Ra_{S2}$ of the second side surface of the component body are the same or substantially the same.

6. The multilayer ceramic electronic component according to claim 1, wherein the thickness of the first external electrode provided on the first side surface of the component body is the same or substantially the same as the thickness of the first external electrode provided on the second side surface; and the thickness of the second external electrode provided on the first side surface of the component body is the same or substantially the same as the thickness of the second external electrode provided on the second side surface.

7. The multilayer ceramic electronic component according to claim 1, wherein each of the first and second external electrodes includes a foundation layer and a plating layer provided on the foundation layer.

8. The multilayer ceramic electronic component according to claim 7, wherein the foundation layer includes at least one of Cu, Ni, Ag, Pd, Ag-Pd alloy, and Au.

9. The multilayer ceramic electronic component according to claim 7, wherein the plating layer has a two-layer structure including a Ni plating layer and an Sn plating layer.

10. The multilayer ceramic electronic component according to claim 1, wherein the surface roughness of the first main surface is different from the surface roughness of the second main surface.

* * * * *